US011353480B2

(12) United States Patent
Siddharth et al.

(10) Patent No.: US 11,353,480 B2
(45) Date of Patent: Jun. 7, 2022

(54) FLUX ABSORBER FOR POWER LINE DEVICE

(71) Applicant: ABB Schweiz Ag, Baden (CH)

(72) Inventors: Vivek Siddharth, Greenville, NC (US); Lei Wang, Knightdale, NC (US); Jaroslaw Wojciech Chorzepa, Greenville, NC (US); Steve A. Shaw, Greenville, NC (US); Bandeep Singh, Knightdale, NC (US); David Raschka, Greenville, NC (US)

(73) Assignee: ABB SCHWEIZ AG, Baden (CH)

( * ) Notice: Subject to any disclaimer, the term of this patent is extended or adjusted under 35 U.S.C. 154(b) by 35 days.

(21) Appl. No.: 16/838,438

(22) Filed: Apr. 2, 2020

(65) Prior Publication Data

US 2020/0233018 A1   Jul. 23, 2020

Related U.S. Application Data

(63) Continuation of application No. PCT/US2018/053758, filed on Oct. 1, 2018.
(Continued)

(51) Int. Cl.
*G01R 15/18*  (2006.01)
*G01R 33/02*  (2006.01)

(52) U.S. Cl.
CPC .......... *G01R 15/185* (2013.01); *G01R 33/02* (2013.01)

(58) Field of Classification Search
None
See application file for complete search history.

(56) References Cited

U.S. PATENT DOCUMENTS 4,841,235 A   6/1989 Hastings et al.
5,132,497 A   7/1992 Moldovan et al.
(Continued)

FOREIGN PATENT DOCUMENTS

EP   1879036   1/2008
JP   3758144 B2   3/2006
(Continued)

OTHER PUBLICATIONS

JP2016148620 (Machine English Translation) (Year: 2016).*
(Continued)

*Primary Examiner* — Douglas X Rodriguez
(74) *Attorney, Agent, or Firm* — Greenberg Traurig, LLP

(57) ABSTRACT

Unique systems, methods, techniques and apparatuses of a power line measurement device are disclosed. One exemplary embodiment is a measurement device comprising a measurement device structured to at least partially surround a segment of a power distribution line, the measurement device including a winding portion spaced apart from the segment of the power distribution line structured to receive magnetic flux from the power distribution line and to output data corresponding to a current flowing through the power distribution line; and a magnetic shield spaced apart from the measurement device and positioned radially outward from the winding portion relative to the segment of the power distribution line, the magnetic shield comprising a first section and a second section coupled to the first section at an obtuse angle, the magnetic shield being structured to reduce an amount of external flux from being received with the measurement device.

13 Claims, 3 Drawing Sheets

Related U.S. Application Data

(60) Provisional application No. 62/566,630, filed on Oct. 2, 2017.

(56) References Cited

U.S. PATENT DOCUMENTS

| | | | |
|---|---|---|---|
| 5,757,183 | A | 5/1998 | Smith et al. |
| 6,184,672 | B1 | 2/2001 | Berkcan |
| 6,788,046 | B2 | 9/2004 | Lenhard et al. |
| 7,397,233 | B2 | 7/2008 | Sorensen |
| 7,663,358 | B2 | 2/2010 | Hashio et al. |
| 8,203,328 | B2 | 6/2012 | Bose et al. |
| 8,680,856 | B2 | 3/2014 | Schmitt |
| 9,488,676 | B2 | 11/2016 | Wand |
| 2003/0201873 | A1 | 10/2003 | Cern |
| 2006/0226826 | A1 | 10/2006 | Teppan |
| 2008/0048655 | A1* | 2/2008 | Hausperger ......... G01R 15/207 324/260 |
| 2008/0186021 | A1 | 8/2008 | Hashio et al. |
| 2010/0051342 | A1 | 3/2010 | Diaz |
| 2010/0231198 | A1 | 9/2010 | Bose et al. |
| 2011/0043190 | A1 | 2/2011 | Farr |
| 2013/0342188 | A1* | 12/2013 | McKinley ............ G01R 15/181 324/126 |
| 2014/0111190 | A1 | 4/2014 | Ryochi et al. |
| 2015/0097560 | A1 | 4/2015 | Kawakami et al. |
| 2015/0241483 | A1 | 8/2015 | Berton et al. |
| 2015/0248962 | A1 | 9/2015 | Hodge et al. |
| 2015/0270058 | A1 | 9/2015 | Golko et al. |
| 2015/0292962 | A1 | 10/2015 | Lu et al. |
| 2016/0057897 | A1 | 2/2016 | Malek et al. |
| 2016/0064814 | A1 | 3/2016 | Jang et al. |
| 2016/0216304 | A1* | 7/2016 | Sekelsky ................ B60L 53/32 |
| 2016/0313374 | A1 | 10/2016 | Morimoto et al. |
| 2016/0314679 | A1 | 10/2016 | Dodds et al. |
| 2019/0146008 | A1* | 5/2019 | Shaw ................ G01R 19/0092 324/127 |

FOREIGN PATENT DOCUMENTS

| | | | |
|---|---|---|---|
| JP | 2012019005 | A | 1/2012 |
| JP | 2016148620 | * | 8/2016 |
| JP | 2016148620 | A | 8/2016 |
| WO | 2014162687 | A1 | 10/2014 |
| WO | 2015147788 | A1 | 10/2015 |
| WO | 2016035606 | | 3/2016 |

OTHER PUBLICATIONS

Renesas Electronics America Inc. (REA), "White Paper—Sensing Elements for Current Measurements," dated Aug. 8, 2018, 17 pp., Milpitas, US, available at https://www.renesas.com/us/en/www/doc/whitepapers/amplifiers/current-sense-measurements.pdf, last accessed Apr. 15, 2020.

G. Roemer, "White Paper—Current Sensors in Power Metering Applications," dated Feb. 2, 2010, 4 pp., Winnipeg, CA, available at https://www.pulseelectronics.com/docs/graf/smart_grid_white_paper.pdf, last accessed Apr. 15, 2020.

GMW Associates, "Operation and application of the Sentron CSA-1V-SO surface mount current sensor," Current Sensing with the CSA-1V Hall IC, dated Nov. 2004, 21 pp., San Carlos, US, available at https://gmw.com/wp-content/uploads/2019/02/AN_102_REV_C.pdf, last accessed Apr. 15, 2020.

Patent Cooperation Treaty, International Search Report and Written Opinion in corresponding application No. PCT/US2018/053758, dated Dec. 3, 2018, 13 pp.

Supplementary European Search Report, EP Appln. Serial No. 18864511 3, dated Jun. 30, 2021, 16 pgs.

* cited by examiner

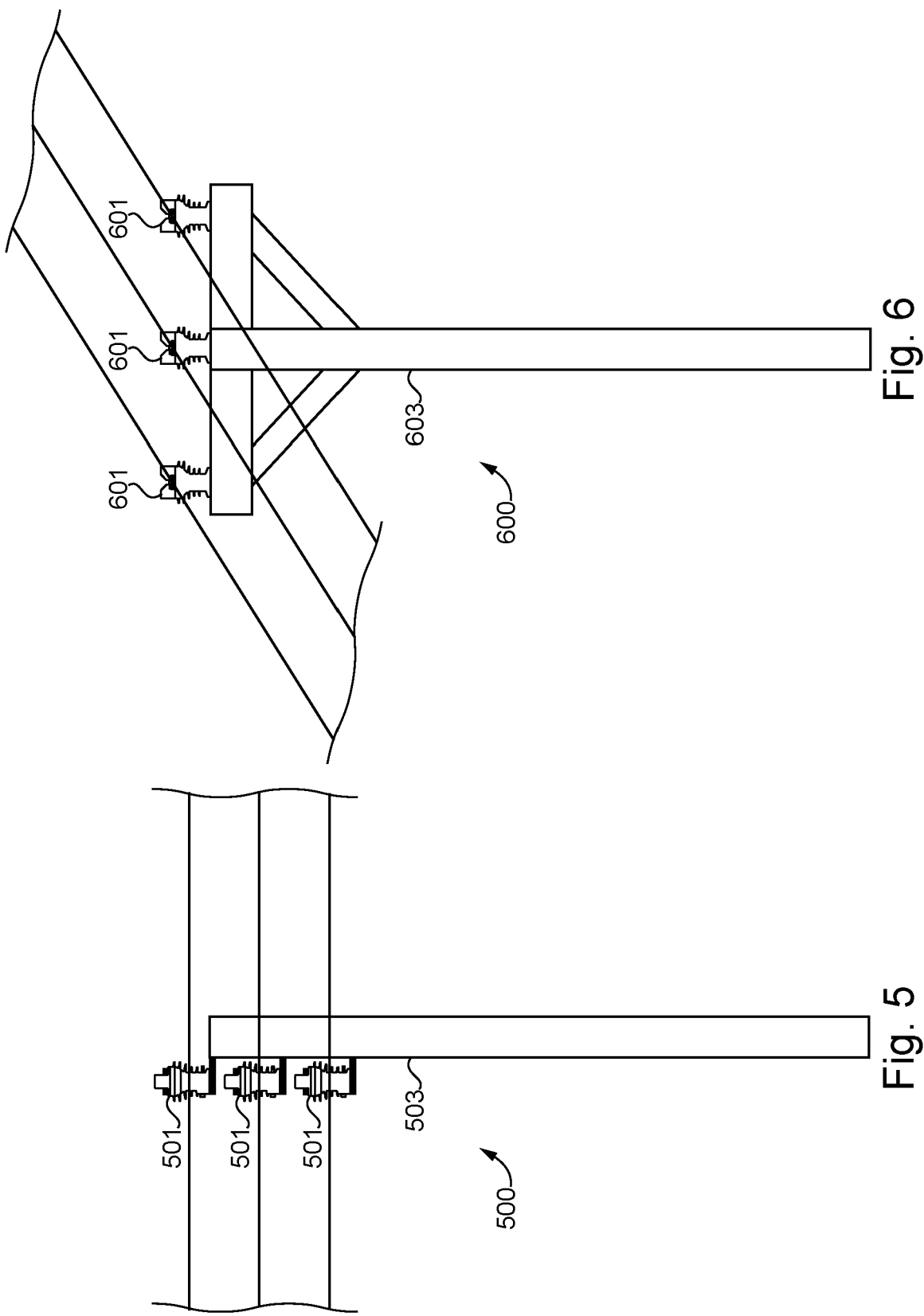

FLUX ABSORBER FOR POWER LINE DEVICE

BACKGROUND

The present disclosure relates generally to power line measurement devices. With the advent of smart grid systems, measurement devices are gaining importance in power distribution networks. Some measurement devices are used to detect power line conditions such as current. Existing measurement devices suffer from a number of shortcomings and disadvantages. There remain unmet needs including higher stray flux tolerance, increased accuracy, and increased operator safety. For instance, interference from nearby electrical equipment such proximate power lines can cause inaccurate readings for conventional measurement devices. There is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY

Exemplary embodiments include unique systems, methods, techniques and apparatuses for power line measurement device shielding. Further embodiments, forms, objects, features, advantages, aspects and benefits of the disclosure shall become apparent from the following description and drawings.

BRIEF DESCRIPTION OF THE DRAWINGS

FIG. 5 illustrates a vertical arrangement of a plurality of exemplary power line devices including exemplary shields.

FIG. 6 illustrates a horizontal arrangement of a plurality of exemplary power line devices including exemplary shields.

DETAILED DESCRIPTION OF ILLUSTRATIVE EMBODIMENTS

Figure 1:
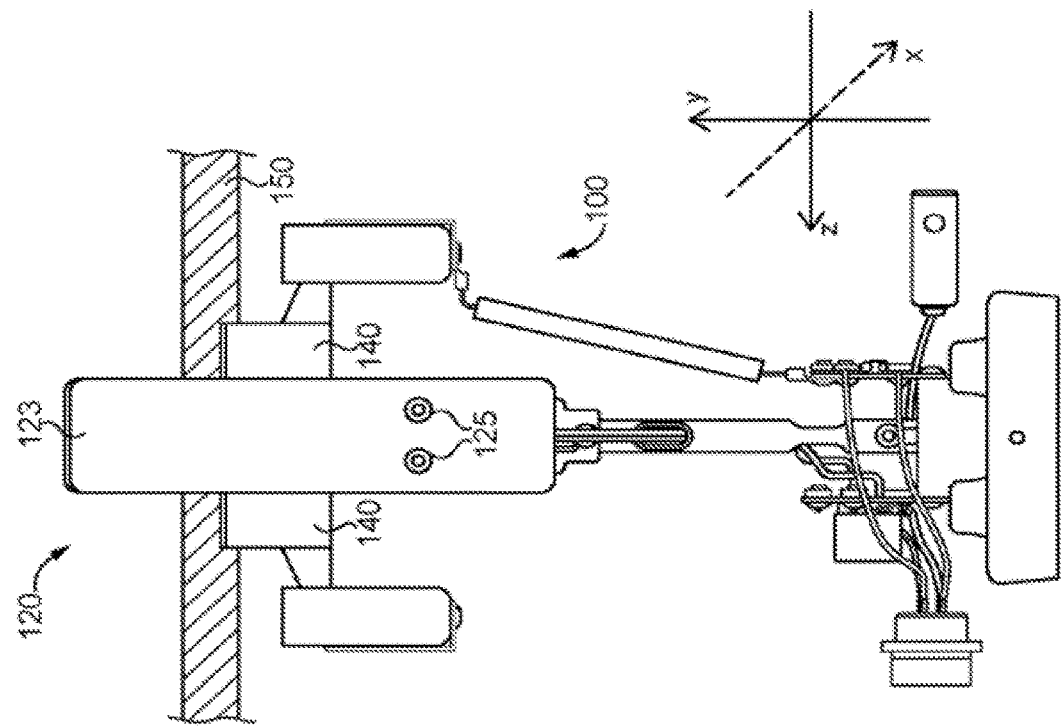
FIG. 1 illustrates a front view of an exemplary power line device including an exemplary shield.

With reference to FIG. 1 there is illustrated an exemplary power line device 100 affixed to a conductor 150 and structured to measure current flowing through conductor 150. It shall be appreciated that current power line device 100 may be implemented in a variety of applications, including power transmission networks, power distributions networks, high voltage power networks, medium voltage power networks, and low voltage power networks, to name but a few examples. In certain embodiments, power line device 100 is encapsulated by a housing.

Power line device 100 includes two flux absorbers 110, 120, also known as magnetic shields; a hybrid magnetic circuit 130; and a conductor housing 140, all coupled to a base 160. Conductor housing 140 is structured to affix conductor 150 to Power line device 100. It shall be appreciated that conductor housing 140 may include any arrangement structured to affix conductor 150 to Power line device 100 and the illustrated embodiment is not intended as a limitation on the arrangement of housing 140. In other embodiments, power line device 100 includes another type of sensor instead of hybrid magnetic circuit 130. In other embodiments, power line device 100 includes another type of measurement device, such as an instrument transformer or a linear transducer, to name but a few examples.

Hybrid magnetic circuit 130 includes cores 131, 133 arranged around conductor 150 and separated by a large air gap. In certain embodiments, cores 131 and 133 are comprised of magnetic material. Core 131 is wrapped in a winding 135 and core 133 is wrapped in a winding 135. Circuit 130 receives magnetic flux via windings 135 and 137 generated by power transmission through conductor 150 and outputs a voltage proportional to the magnetic flux intensity. Since flux intensity is proportional to conductor 150 current, the output voltage corresponds to the current through conductor 150. In other embodiments, hybrid magnetic circuit 130 includes only one core and one winding. For example, one core and one winding may be arranged parallel with the x-axis. In other embodiments, circuit 130 includes more than two cores.

Cores 131 and 133 are separated from conductor 150 by distances 103 and 105, respectively, forming an air gap. The large air gap between cores 131 and 133 allows hybrid magnetic circuit 130 to output a low voltage even where conductor 150 is a high voltage transmission line. For example, the circuit may output a voltage between 0 and 10 V which corresponds to the magnitude of the current flowing through conductor 150. The low voltage output is safer for field personnel. In other embodiments, hybrid magnetic circuit 130 may output another electrical characteristic, such as current, corresponding the magnitude of the current flowing through conductor 150. In certain embodiments, the air gap including both distances 103 and 105, between cores 131 and 133, may be between 4.5 and 5 inches. In certain embodiments, the distance between cores 131 and 133 may be between 4 and 5.5 inches.

Hybrid magnetic circuit 130 is susceptible to interference from external flux, also known as stray flux. External flux may be generated by other power lines, instrument transformers, or other types of electrical equipment. This external flux affects the flux distribution of conductor 150 causing a change in net flux linkage between cores 131 and 133. Since the voltage output is proportional to the flux linkage, the external flux causes a voltage output that does not accurately correspond to the amount of current flowing through conductor 150.

Absorbers 110 and 120 are structured to block external flux by absorbing external flux. In other embodiments, power line device 100 may include only one flux absorber or more than two flux absorbers. In the illustrated embodiment, each shield includes an outer layer 113, 123 and an inner layer 111, 121 separated by an insulator. In other embodiments, flux absorber layers are not separated by an insulator. In certain embodiments, the outer layer is comprised of low permeability material to block the external flux. For example, the outer layers may be comprised of copper having a sufficient thickness to reflect stray flux, such as a thickness of 8.4 mm. Inner layer 111, 121 is structured to not interfere with the flux distribution caused by power transmission through conductor 150. In certain embodiments, inner layers 111, 121 or cores 131 and 133 are comprised of ferromagnetic material. In certain embodiments, inner layers 111 and 121 are comprised of the same material as cores 131 and 133. For example, the inner layers and cores may be comprised of one or more of M4 steel, M3 steel, silicon steel, mild steel, cobalt sheet, nickel sheet, iron sheet, or another type of material with high permeability. In other embodiments, each layer of absorbers 110 and 120 are comprised of the same high permeability material. In certain embodiments, absorbers 110 and 120 include one layer or more than two layers, such as four layers of M4 steel.

In order to absorb the external flux without affecting the flux distribution caused by conductor 150, absorbers 110, 120 must be sized, shaped, oriented, and located in a particular configuration based on the operating characteristics of the conductor 150 and operating environment. For example, absorber 110 and core 131 are separated by a distance 101, just as shield 123 and core 133 are separated by a distance 107. Distances 101 and 107 must be large enough to prevent interference with the conductor flux distribution by absorbers 110 and 120. For example, distances 101 and 107 may be between 1.5 inches and 2 inches.

In the illustrated embodiment, one end of absorbers 110, 120 is bent at an angle. In another embodiment, at least one of absorber 110 and 120 may be bent on the second end of the absorber. The bend angles may be different for the first end and the second end. It shall be appreciated that any or all of the foregoing features of power line device 100 may also be present in the other power line devices or power line device components disclosed herein.

Figure 2:
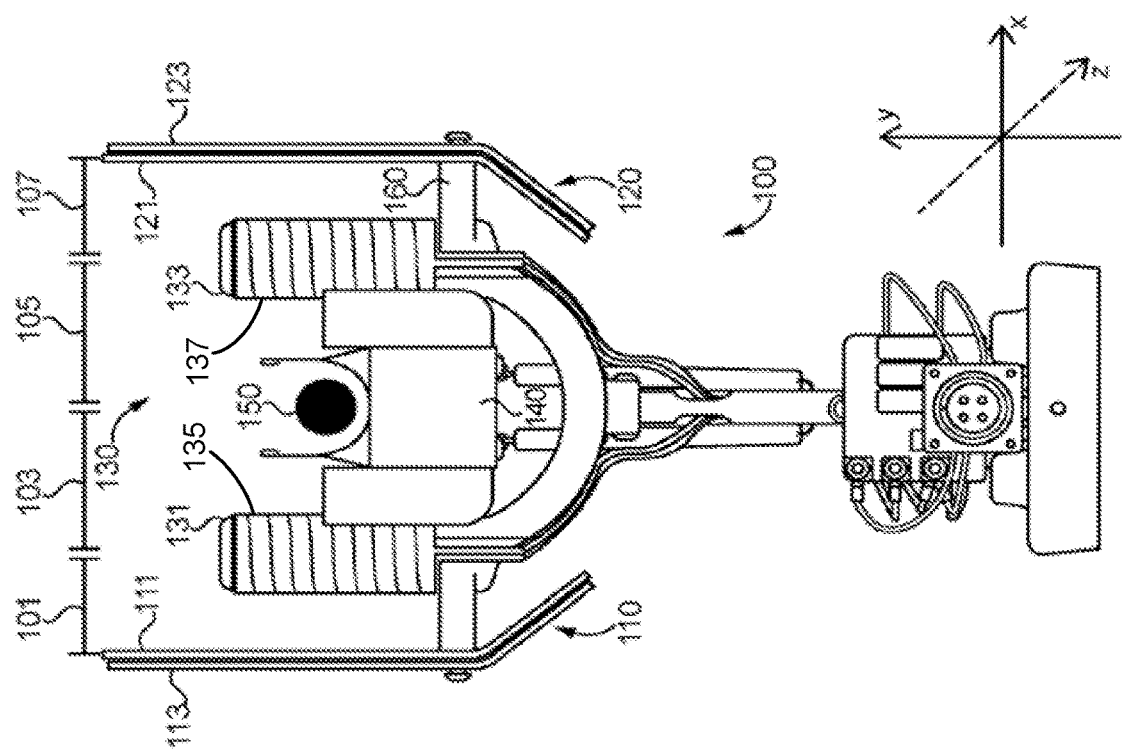
FIG. 2 illustrates a side view of the exemplary power line device of FIG. 1.

With reference to FIG. 2, there is illustrated another view of power line device 100 in which power line device 100 has been rotated 90 degrees clockwise relative to the x-z plane. Flux absorber 120 includes two holes 125 structured to allow fasteners to pass through flux absorber 120, affixing absorber 120 to the base and grounding absorber 120. It shall be appreciated that absorber 110 may be similarly attached to the base of power line device 100. It is important to note flux absorber 120 is purposefully wider than both cores of hybrid magnetic circuit 130 in order to block stray flux which would otherwise interfere with hybrid magnetic circuit 130. It also important to note that cores 131, 133 and flux absorbers 110, 120 are aligned along the x axis.

Figure 3:
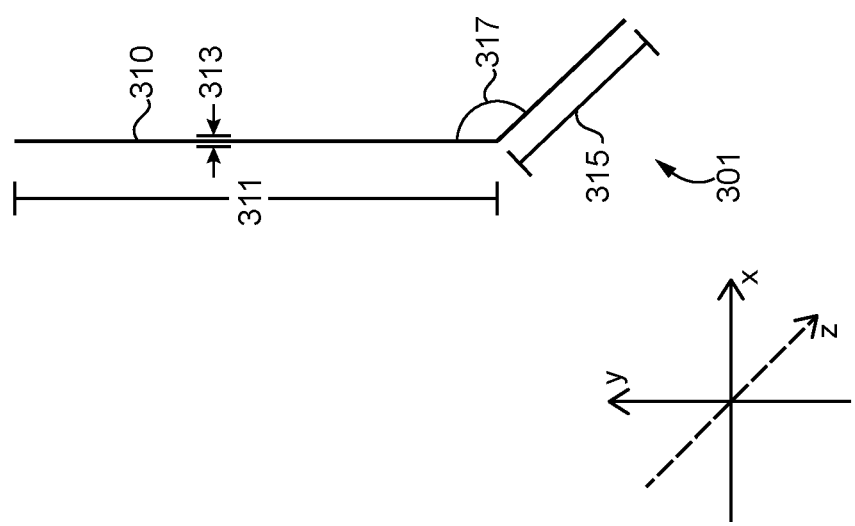
FIG. 3 illustrates a side view of an exemplary shield.

With reference to FIG. 3 there is illustrated a flux absorber 301, such as absorber 110 of power line device 100 in FIG. 1. Absorber 301 includes at least one plate 310 bent at an angle 317 forming a first flat section with a length 311 of 5 inches and a second flat section with a length 315 of 1.7 inches. In the illustrated embodiment, angle 317 is approximately 135 degrees. In certain embodiments, angle 317 may be between 130 degrees and 140 degrees. In certain embodiments, angle 317 may be between 125 degrees and 145 degrees. In certain embodiments, plate 310 has a uniform thickness 313. For example, plate 310 may have a thickness 313 of 0.04 inches. In certain embodiments, thickness 313 is between 0.02 and 0.06 inches. In certain embodiments, flux absorber includes a plurality of superimposed plates. In certain embodiments, length 311 is between 4.2 inches and 5.5 inches, and length 315 is between 1.7 inches and 2.1 inches. Length 311 may be adjusted so that length 311 is greater than a length of cores 131, 133.

Figure 4:
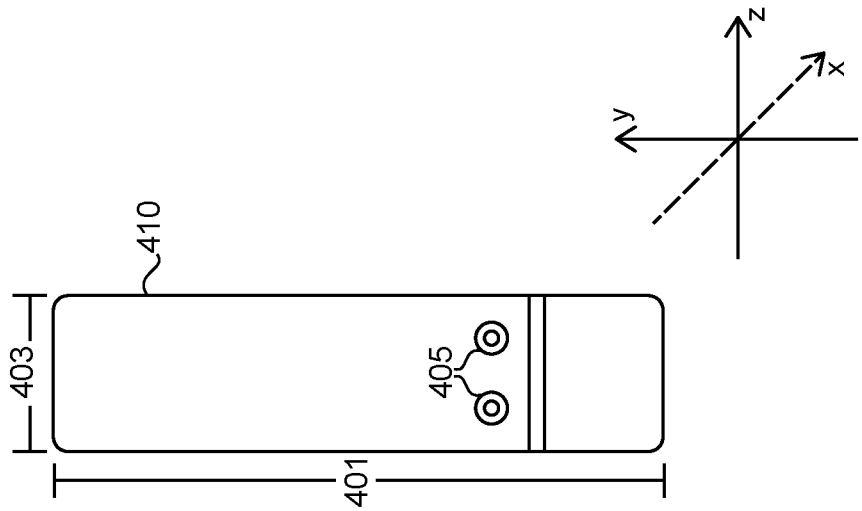
FIG. 4 illustrates a front view of the exemplary shield of FIG. 3.

With reference to FIG. 4 there is illustrated a flux absorber 410, such as absorber 110 of power line device 100 in FIG. 1. Absorber 410 includes two holes 405 so as to allow a fastener to affix absorber 410 to the base of power line device 100. In other embodiments, absorber 410 may be modified in other ways so as to allow plate 410 to be secured to a power line device 100 base. Absorber 410 has a width 403 and a length 401. In certain embodiments, width 403 is between 1 inch and 1.7 inches where core 131, 133 width is 1.2 inches. In certain embodiments, length 401 is between 5.5 and 7.7 inches.

With reference to FIG. 5 there is illustrated an exemplary power distribution system 500 including a utility pole 503 and one power line device 501 for each distribution line, each device 501 with features analogous to power line device 100 of FIG. 1. Each device 501 is coupled to utility pole 503 and one power distribution line. The devices 501 are arranged in a vertical configuration. In other embodiments, the number of distribution lines may be greater than the number of power line devices 501, the number of power line devices 501 may be more or less than the number of power line devices illustrated in system 500, and the number of distribution lines may be more or less than the number of lines in the illustrated system 500. In other embodiments, utility pole 503 may be another structure for suspending distribution lines, such as transmission towers or h-frame structures.

With reference to FIG. 6 there is illustrated an exemplary power distribution system 600 including a utility pole 603 and one power line device 601 for each distribution line, each power line device with features analogous to power line device 100 of FIG. 1. Each power line device 601 is coupled to utility pole 603 and one power distribution line. The power line devices 601 are arranged in a horizontal configuration. In other embodiments, the number of distribution lines may be greater than the number of power line devices 601, the number of power line devices 601 may be more or less than the number of power line devices illustrated in system 600, and the number of distribution lines may be more or less than the number of lines in the illustrated system 600. In other embodiments, utility pole 603 may be another structure for suspending distribution lines, such as transmission towers or h-frame structures.

Further written description of a number of exemplary embodiments shall now be provided. One embodiment is a power line device comprising a measurement device structured to at least partially surround a segment of a power distribution line, the measurement device including a winding portion spaced apart from the segment of the power distribution line structured to receive magnetic flux from the power distribution line and to output data corresponding to a current flowing through the power distribution line; and a magnetic shield spaced apart from the measurement device and positioned radially outward from the winding portion relative to the segment of the power distribution line, the magnetic shield comprising a first section and a second section coupled to the first section at an obtuse angle, the magnetic shield being structured to reduce an amount of external flux from being received with the measurement device.

In certain forms of the foregoing device, the measurement device comprises a second winding portion spaced apart from the segment of the power distribution line at a location spaced apart from and facing the first winding portion and two cores arranged such that the power distribution line passes between the two cores. In certain forms, the magnetic shield comprises a third section coupled to the first section at a second obtuse angle, wherein the first obtuse angle and the second obtuse angle are different. In certain forms, the measurement device comprises a core, and the core and magnetic shield are comprised of the same material. In certain forms, the core and the magnetic shield are comprised of M4 steel. In certain forms, the magnetic shield consists essentially of an inside layer facing the measurement device and an outside layer facing away from the measurement device, and wherein the inner layer is comprised of the same material as the core, but the outside layer is not comprised of the same material. In certain forms, the external flux is generated by a second power distribution line proximate to the measurement device, and wherein the first power distribution line and the second power distribution line are arranged horizontally or vertically. In certain forms, each shield of the pair of magnetic shields are located a first distance from the segment of the power distribution line and the winding portion is located a second distance from the power distribution line, wherein the first distance is greater than the second distance. In certain forms, the device comprises a second magnetic shield. In certain forms, the first magnetic shields consist essentially of the first section and the second section coupled to the first section at the obtuse angle and the second magnetic shield consist essentially of a third section and a fourth section coupled to the third section at an obtuse angle. In certain forms, the first and second magnetic shields are oriented such that their respective first and third sections are parallel to one another and their respective second and fourth sections extend inward toward one another from portions of their respective first and third sections which are oriented in the same direction relative to the segment of the power distribution line.

Another exemplary embodiment is a measurement device comprising a magnetic circuit including at least one core and an air gap, the magnetic circuit arranged so as to receive flux from a conductor and output an electrical characteristic value corresponding to a current flowing through the conductor; and a flux absorber including at least one layer comprised of the same material as the core, wherein the at least one layer of the flux absorber forms a plate structured as a first flat section and a second flat section such that the angle between the first flat section and the second flat section is obtuse.

In certain forms of the foregoing device, the magnetic circuit includes a second core, wherein the first core and the second core are arranged such that the conductor passes between the first and second core, and the air gap is defined as the distance between the first and second core. In certain forms, the one layer of the first and second flux absorber and the core are comprised of a high permeability material. In certain forms, the one layer of the first and second flux absorbers and the core consist essentially of M4 steel. In certain forms, the width of the flux absorber is greater than the width of the core. In certain forms, a first distance between the core and the conductor is greater than a second distance between the conductor and the flux absorber. In certain forms, the flux absorber includes a third flat section such that the angle between the first flat section and the third flat section is obtuse. In certain forms, the magnetic shielding is grounded. In certain forms, the device comprises a second flux absorber. In certain forms, the first and second flux absorbers consist essentially of the first flat section and the second flat section coupled to the first section at the obtuse angle. In certain forms, the first and second flux absorbers are oriented such that their respective first flat sections are parallel to one another and their respective second flat sections extend inward toward one another from portions of their respective first flat sections which are oriented in the same direction relative to the segment of the power distribution line.

A further exemplary embodiment is a flux absorbing shield comprising a plurality of superimposed sheets having a length and a width, the length being longer than the width, wherein the superimposed sheets are bent at least once across the width, wherein the angle of the bend is obtuse, and wherein the plurality of superimposed sheets includes an inner sheet comprised of a high permeability material.

In certain forms of the foregoing shield, the bend forms a first flat section of the plurality of sheets greater than twice the length of a second flat section of the plurality of sheets. In certain forms, the inner sheet is comprised of a silicon steel plate. In certain forms, It is contemplated that the various aspects, features, processes, and operations from the various embodiments may be used in any of the other embodiments unless expressly stated to the contrary. Certain operations illustrated may be implemented by a computer executing a computer program product on a non-transient computer readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "coupled to," "coupled with" and the like include indirect connection and coupling and further include but do not require a direct coupling or connection unless expressly indicated to the contrary. When the language "at least a portion" and/or "a portion" is used the item can include a portion and/or the entire item unless specifically stated to the contrary.

What is claimed is:

1. A power line device comprising:
a measurement device structured to at least partially surround a segment of a power distribution line, the measurement device including a first winding portion spaced apart from the segment of the power distribution line and a second winding portion spaced apart from the segment of the power distribution line at a location spaced apart from and facing the first winding portion and two cores arranged such that the power distribution line passes between the two cores and structured to receive magnetic flux from the power distribution line and to output data corresponding to a current flowing through the power distribution line; and a magnetic shield spaced apart from the measurement device and positioned radially outward from the first winding portion and the second winding portion relative to the segment of the power distribution line, the magnetic shield comprising a first section and a second section coupled to the first section at a first obtuse angle, the magnetic shield being structured to reduce an amount of external flux from being received with the measurement device.

2. The power line device of claim 1, wherein the first winding portion is separated from the power distribution line by a first distance and the second winding portion is separated from the power distribution line by a second distance, the first winding portion and the second winding portion each forming an air gap.

3. The power line device of claim 1, wherein the magnetic shield comprises a third section coupled to the first section at a second obtuse angle, wherein the first obtuse angle and the second obtuse angle are different.

4. The power line device of claim 1, wherein the measurement device comprises a core, and the core and the magnetic shield are comprised of the same material.

5. The power line device of claim 4, wherein the core and the magnetic shield are comprised of M4 steel.

6. The power line device of claim 1, wherein the magnetic shield consists essentially of an inside layer facing the measurement device and an outside layer facing away from the measurement device, wherein the measurement device comprises a core, and wherein the inside layer is comprised of the same material as the core, but the outside layer is not comprised of the same material.

7. The power line device of claim 1, wherein the external flux is generated by a second power distribution line proximate to the measurement device, and wherein the power distribution line and the second power distribution line are arranged horizontally or vertically.

8. The power line device of claim 1, wherein the first section and the second section of the magnetic shield are located a first distance from the segment of the power distribution line and the first winding portion is located a second distance from the power distribution line, wherein the first distance is greater than the second distance.

9. The power line device of claim 1, wherein the magnetic shield is a first magnetic shield, and comprising a second magnetic shield.

10. The power line device of claim 9, wherein the first magnetic shield consists essentially of the first section and the second section coupled to the first section at the first obtuse angle and the second magnetic shield consists essentially of a third section and a fourth section coupled to the third section at an obtuse angle.

11. The power line device of claim 10, wherein the magnetic shields are oriented such that their respective first and third sections are parallel to one another and their respective second and fourth sections extend inward toward one another from portions of their respective first and third sections which are oriented in the same direction relative to the segment of the power distribution line.

12. The power line device of claim 10, wherein the measurement device comprises a core, wherein a width of the magnetic shield is greater than a width of the core.

13. The power line device of claim 10, wherein the measurement device comprises a core, wherein a first distance between the core and the power distribution line is greater than a second distance between the power distribution line and the magnetic shield.

* * * * *